United States Patent
Choi et al.

(10) Patent No.: US 9,479,178 B2
(45) Date of Patent: Oct. 25, 2016

(54) DIGITAL COUNTER

(71) Applicants: SK hynix Inc., Gyeonggi-do (KR);
Industry-University Cooperation Foundation Hanyang University, Seoul (KR)

(72) Inventors: Byong Deok Choi, Seoul (KR); Jong Seok Kim, Gyeongsangnamdo (KR); Don Ku Lee, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/563,525

(22) Filed: Dec. 8, 2014

(65) Prior Publication Data

US 2016/0056824 A1   Feb. 25, 2016

(30) Foreign Application Priority Data

Aug. 25, 2014  (KR) ........................ 10-2014-0110758

(51) Int. Cl.
*H03K 23/00* (2006.01)
*H03K 23/40* (2006.01)

(52) U.S. Cl.
CPC ................... *H03K 23/40* (2013.01)

(58) Field of Classification Search
None
See application file for complete search history.

(56) References Cited

U.S. PATENT DOCUMENTS

| 6,269,138 | B1 | 7/2001 | Hansson | |
|---|---|---|---|---|
| 8,421,891 | B2* | 4/2013 | Morikawa | H03M 1/0624 341/155 |
| 9,214,944 | B2* | 12/2015 | Kim | H03K 21/38 |
| 2010/0207798 | A1* | 8/2010 | Lim | H03K 21/023 341/155 |
| 2010/0225796 | A1* | 9/2010 | Lim | H03M 1/0607 348/308 |
| 2014/0341332 | A1* | 11/2014 | Kim | H03K 21/023 377/118 |

FOREIGN PATENT DOCUMENTS

| KR | 1020100092542 | 8/2010 |
|---|---|---|
| KR | 1020110033583 | 3/2011 |

* cited by examiner

*Primary Examiner* — Long Nguyen
(74) *Attorney, Agent, or Firm* — IP & T Group LLP

(57) ABSTRACT

A digital counter may include a first count unit suitable for outputting a first bit signal having a constant level in response to a first clock signal, a second count unit suitable for outputting a second bit signal having a constant level in response to a second clock signal, and a third count unit suitable for outputting a third bit signal toggling in response to the second clock signal, and performing a count operation.

6 Claims, 6 Drawing Sheets

DIGITAL COUNTER

CROSS-REFERENCE TO RELATED APPLICATIONS

The present application claims priority of Korean Patent Application No. 10-2014-0110758, filed on Aug. 25, 2014, which is incorporated herein by reference in its entirety.

BACKGROUND

1. Field

The present invention relates to a counter, and more particularly, to a digital counter used in a CMOS (Complementary Metal Oxide Semiconductor) image sensor.

2. Description of the Related Art

The Complementary Metal Oxide Semiconductor (CMOS) image sensor (CIS) has been widely used as image input devices of mobile phone cameras or CCTVs. CMOS image sensors operating digitally include several thousand digital counters. These digital counters increase power consumption.

An n-bit digital counter includes n D-flip-flops, and is configured to receive external clock signals and increase the digital output value by 1 at each rising edge of the clock signal.

Power consumption in the digital counter occurs when a digital signal toggles/pulses, for example, when the digital signal transitions from a logic low level to a logic high level. In the conventional digital counter, the digital signal toggles at each cycle of the clock signal. Since power consumption occurs when a signal toggles, CMOS image sensor power consumption inevitably increases as the number of digital counters increases.

SUMMARY

The present invention provides a digital counter capable of reducing power consumption.

According to one aspect of the present invention, a digital counter includes a first count unit suitable for outputting a first bit signal having a constant level in response to a first clock signal, a second count unit suitable for outputting a second bit signal having a constant level in response to a second clock signal, and a third count unit suitable for outputting a third bit signal toggling in response to the second clock signal, and performing a count operation.

According to another aspect of the present invention, a digital counter includes: a first count unit suitable for generating one of a plurality of external clock signals inputted from outside as a first internal clock signal, and outputting a first bit signal having a constant level in response to the first internal clock signal, a second count unit suitable for generating one of the external clock signals as a second internal clock signal, and outputting a second bit signal having a constant level in response to the second internal clock signal, and a third count unit suitable for outputting a third bit signal in response to one of the external clock signals, and performing one of an up count operation and a down count operation in response to an up count signal and a down count signal.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF EMBODIMENTS

Figure 1:
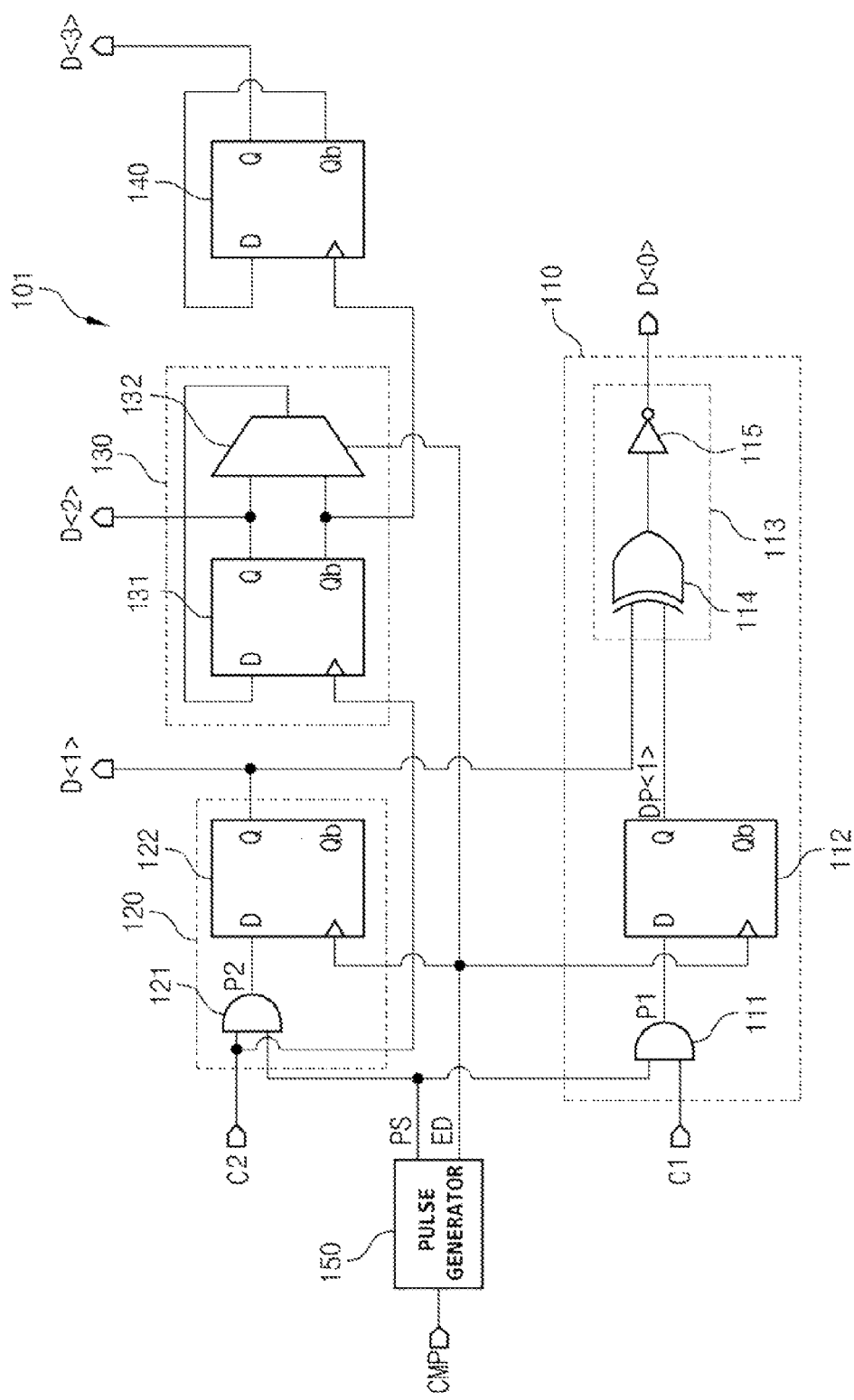
FIG. 1 is a circuit diagram of a digital counter according to a first embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a circuit diagram of a digital counter 101 according to a first embodiment of the present invention. Referring to FIG. 1, the digital counter 101 includes a pulse generator 150 and first to fourth count units 110 to 140. The digital counter 101 receives a main count completion signal CMP, a first clock signal C1, and a second clock signal C2 from outside, and outputs four-bit count signals D<0> to D<3>. FIG. 1 illustrates a four-bit digital counter. In another embodiment, a four or more-bit digital counter or a four or less-bit digital counter may be used. The digital counter 101 performs a count operation in response to the first and second clock signals C1 and C2 inputted from outside. That is, the digital counter 101 increases a digital output value by "1" at each rising edge of the second clock signal C2.

Figure 3:
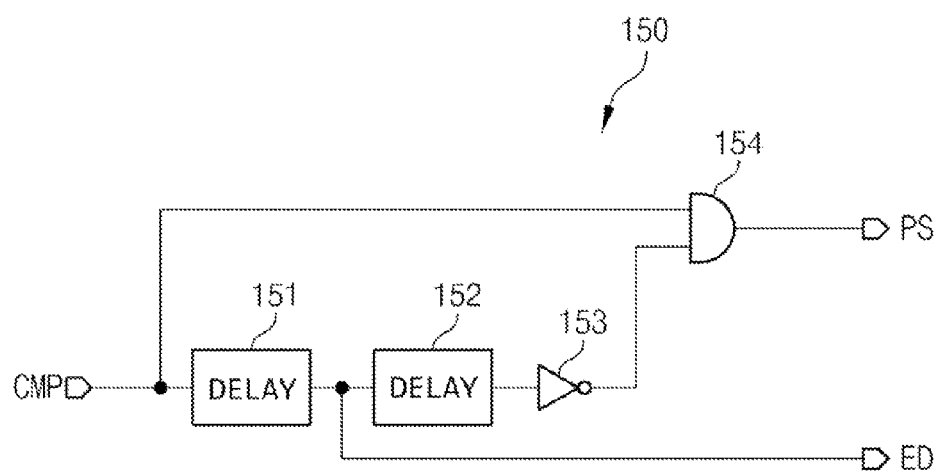
FIG. 3 is a circuit diagram of a pulse generator illustrated in FIG. 1.
Figure 4:
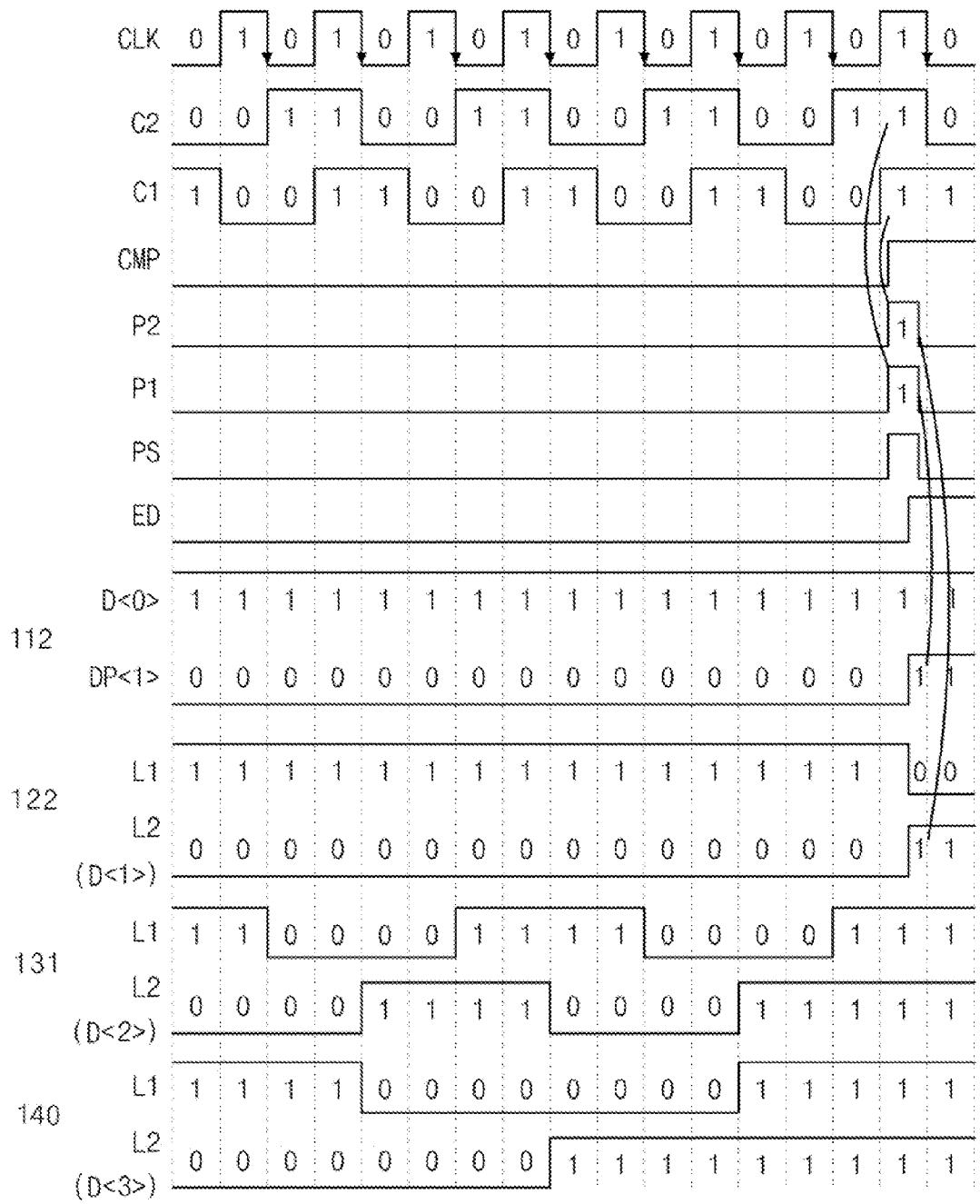
FIG. 4 is a timing diagram of signals of the digital counter of FIG. 1.

FIG. 4 is a timing diagram of signals of the digital counter 101 illustrated in FIG. 1. Hereafter, the configuration and operation of the digital counter 101 illustrated in FIGS. 1 to 3 will be described.

The pulse generator 150 receives the main count completion signal CMP from outside, and outputs a first count completion signal PS and a second count completion signal ED in response to the main count completion signal CMP. The main count completion signal CMP may notify the digital counter 101 that the count operation is completed. The pulse generator 150 is coupled to the first to third count units 110 to 130. Thus, the pulse generator 150 transmits the first and second completion signals PS and ED to the first to third count units 110 to 130. The configuration of the pulse generator 150 will be described in detail with reference to FIG. 3.

The first count unit 110 receives the first clock signal C1, the first count completion signal PS, the second count completion signal ED, and the second bit signal D<1>, and outputs the first bit signal D<0>. The first bit signal D<0> is generated having a constant level, for example, a logic high level. Specifically, the first count unit 110 outputs the first bit signal D<0> at a first constant level, that is, the logic high level, while a count operation is performed, and outputs the first bit signal D<0> at a second constant level, that is, a logic low level, when the count operation is completed. As such, the first bit signal D<0>, that is, the output signal of the first count unit 110 does not toggle while the count operation is performed. Thus, power consumption is reduced.

The first count unit 110 includes a first AND gate 111, a first flip-flop 112, and an exclusive NOR (XNOR) gate 113.

The first AND gate 111 receives the first clock signal C1 and the first count completion signal PS, and performs an AND operation on the received signals. The first AND gate 111 outputs a logic low-level signal regardless of the first clock signal C1, while a count operation is performed, that is, while the first count completion signal PS is at the logic low level. Then, when the count operation is completed, the first count completion signal PS is generated as a pulse. At this time, when the first clock signal C1 is at the logic high level, the first AND gate 111 outputs the same pulse as the first count completion signal PS. After the count operation is completed, the output signal P1 of the first AND gate 111 is maintained at the logic low level until the next count operation is started.

The first flip-flop 112 receives the output signal P1 of the first AND gate 111 and the second count completion signal ED, and outputs a signal DP<1> in response to the output signal P1 of the first AND gate 111. The first flip-flop 112 includes a delay flip-flop. Thus, while the count operation is performed, the output signal DP<1> of the first flip-flop 112 has the same logic low level as the output signal P1 of the first AND gate 111. Then, when the count operation is completed and the output signal P1 of the first AND gate 111 is generated as a pulse, the output signal DP<1> of the first flip-flop 112 transitions to the same logic high level as the second count completion signal ED. That is, when the count operation is completed, the second count completion signal ED transitions from the logic low level to the logic high level. In response to the transition, the output signal DP<1> of the first flip-flop 112 also transitions from the logic low level to the logic high level. This state is continuously maintained until the count operation begins again.

The XNOR gate 113 receives the output signal DP<1> of the first flip-flop 112 and the second bit signal D<1> (outputted from the second count unit 120), and outputs the first bit signal D<0>. That is, the XNOR gate 113 outputs the first bit signal D<0> at the logic low level when any one of the signals inputted to the XNOR gate 113 is at the logic high level, and outputs the first bit signal D<0> at the logic high level when both of the signals inputted to the XNOR gate 113 are at the logic high or low level. Thus, since the output signal DP<1> of the first flip-flop 112 and the second bit signal D<1> are at the logic low level while the count operation is performed, the first bit signal D<0> is outputted at the logic high level. Then, when the count operation is completed, the first bit signal D<0> maintains in the high level because both the output signal DP<1> of the first flip-flop 112 and the second bit signal D<1> are at the logic high level. This state is continuously maintained until the count operation is started again. As illustrated in FIG. 1, the XNOR gate 113 includes an exclusive OR (XOR) gate 114 and an inverter 115.

The second count unit 120 receives the second clack signal C2, the first count completion signal PS, and the second count completion signal ED, and outputs the second bit signal D<1>. The second bit signal D<1> is generated as a signal having a constant level, for example, the logic low level. Specifically, while the count operation is performed, the second count unit 120 outputs the second bit signal D<1> at a first constant level, that is, the logic low level, and when the count operation is completed, the second count unit 120 outputs the second bit signal D<1> at a second constant level, that is, the logic high level. As such, the second bit signal D<1>, that is, the output signal of the second count unit 120, does not toggle while the count operation is performed. Thus, power consumption is reduced.

The second count unit 120 includes a second AND gate 12 and a second flip flop 122.

The second AND gate 121 receives the second clock signal C2 and the first count completion signal PS, and performs an AND operation on the received signals. The second AND gate 121 outputs a logic low-level signal P2 regardless of the second clock signal C2, while the count operation is performed, that is, while the first count completion signal PS is at the logic low level. Then, when the count operation is completed, the first count completion signal PS is generated as a pulse. At this time, when the second clock signal C2 is at the logic high level, the second AND gate 121 outputs the same pulse as the first counting completion signal PS. After the count operation is completed, the output signal P2 of the second AND gate 121 is maintained at the logic low level until the next count operation is started.

The second flip-flop 122 receives the output signal P2 of the second AND gate 121 and the second count completion signal ED, and outputs the second bit signal D<1> in response to the output signal P2 of the second AND gate 121. The second flip-flop 122 includes a delay flip-flop. Thus, while the count operation is performed, the second bit signal D<1> has the same logic low level as the output signal P2 of the second AND gate 121. Then, when the count operation is completed and the output signal P2 of the second AND gate 121 is generated as a pulse, the second bit signal D<i> transitions to the same logic high level as the second count end signal ED. That is, when the count operation is completed, the second count completion signal ED transitions from the logic low level to the logic high level. In response to the transition, the second bit signal D<1> also transitions from the logic low level to the logic high level. This state is continuously maintained until the count operation is started again.

The third count unit 130 receives the second clock signal C2 and the second count completion signal ED, and outputs the third bit signal D<2>. As the third bit signal D<2> toggles in response to the second clock signal C2, a count operation is performed. Then, when the second count completion signal ED is activated to the logic high level to complete the count operation, the third count unit 130 maintains the third bit signal D<2> at the logic high level. That is, when the count operation is completed, the third bit signal D<2> is maintained at the voltage level it had before the main count completion signal CMP transitions to the logic high level, that is, the logic high level.

The third count unit 130 includes a third flip-flop 131 and a multiplexer 132, and performs a count operation. The third flip-flop 131 receives an output signal of the multiplexer 132 and the second clock signal C2, and outputs the third bit signal D<2> and an inverted signal of the third bit signal D<2> in synchronization with the second clock signal C2. The third flip-flop 131 includes a delay flip-flop. Thus, while the count operation is performed, the third bit signal D<2> is outputted as a signal generated by delaying the second clock signal C2, that is, a signal having a period twice as long as the second clock signal C2. The third bit signal D<2> is outputted from an output terminal Q of the third flip-flop 131, and the inverted signal of the third bit signal D<2> is outputted from an inverting output terminal of the third flip-flop 131.

The multiplexer 132 receives the output signals of the third flip-flop 131 and the second count completion signal ED. The output signals may include the third bit signal D<2> and the inverted signal of the third bit signal D<2>. Then, the multiplexer 132 transmits the third bit signal D<2> or the inverted signal of the third bit signal D<2> to the input terminal of the third flip-flop 131, based on the second count completion signal ED. That is, while the count operation is performed, the second count completion signal ED is deactivated to the logic low level. Thus, the multiplexer 132 selects the inverted signal of the third bit signal D<2>, and transmits the selected signal to the input terminal of the third flip-flop 131. Then, when the count operation is completed and the second count completion signal ED transitions from the logic low level to the logic high level, the multiplexer 132 selects the third bit signal D<2> and transmits the selected signal to the input terminal of the third flip-flop 131. When the count operation is completed, the third bit signal D<2> is maintained at the logic high level. Thus, the third flip-flop 131 stops the count operation, and the third bit signal D<2> is maintained at the voltage level it had before the main count completion signal CMP transitions to the logic high level, that is, the logic high level.

The fourth count unit 140 receives the inverted signal of the third bit signal D<2>, outputted from the third count unit 130, and outputs the fourth bit signal D<3>. The fourth count unit 140 performs a count operation by outputting the fourth bit signal D<3> in response to the inverted signal of the third bit signal D<2>. The fourth count unit 140 includes a fourth flip-flop 140. The fourth flip-flop 140 may be configured with a delay flip-flop.

In order to increase the range (the number of bits it can count) of the digital counter 101, more count units having the same configuration as the fourth count unit 140 may be added.

According to the first embodiment of the present invention, while the count operation is performed, the first and second bit signals D<0> and D<1> outputted from the first and second count units 110 and 120, in charge of lower two bits of the digital counter 101, do not toggle, but they are maintained at a constant level. As the first and second bit signals D<0> and D<1> do not toggle while the count operation is performed, power consumption of the digital counter 101 may be significantly reduced.

Figure 2:
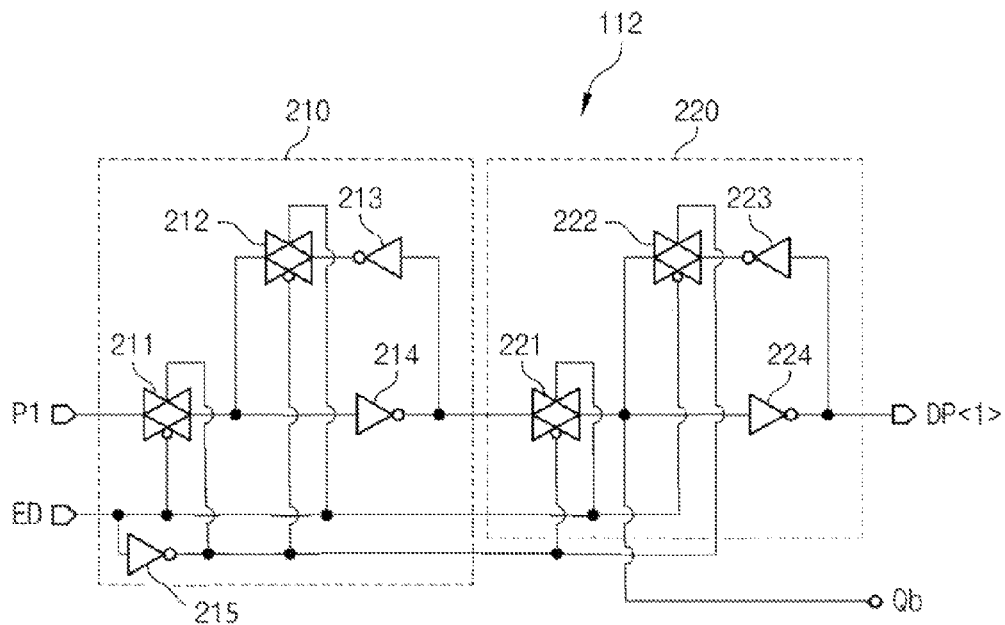
FIG. 2 is a circuit diagram of a first flip-flop illustrated in FIG. 1.

FIG. 2 is a circuit diagram of the first flip-flop 112 illustrated in FIG. 1. Referring to FIG. 2, the first flip-flop 112 includes a first latch 210 and a second latch 220. The first to fourth flip-flops 112, 122, 131, and 140 provided in the digital counter 101 of FIG. 1 may have the same configuration, and FIG. 2 representatively illustrates the first flip-flop 112.

The first latch 210 delays the output signal P1 of the first AND gate 111 by a predetermined time, in a state where the output signal P1 is latched. The first latch 210 may include two transmission gates 211 and 212 and three inverters 213, 214, and 215. Each of the two transmission gates 211 and 212 receives the second count completion signal ED and an output signal of the inverter 215, and the inverter 215 inverts the second count completion signal ED. The transmission gate 211 is turned on to output an input signal when the second count completion signal ED is at the logic low level, and turned off to not output an input signal when the second count completion signal ED is at the logic high level. On the other hand, the transmission gate 212 is turned on to output an input signal when the second count completion signal ED is at the logic high level, and turned off to not output an input signal when the second count completion signal ED is at the logic low level. The output signal P2 of the first AND gate 111, inputted to the first latch 210, is latched by the two inverters 213 and 214. Thus, when the second count completion signal ED inputted to the two transmission gates 211 and 212 is a pulse signal, the output signal P2 of the second AND gate 111, inputted to the inverter 214, is inverted to toggle. However, the second count completion signal ED inputted to the first and second count units 110 and 120 provided in the digital counter 101 according to the first embodiment of the present invention is maintained at a constant level, for example, the logic high or low level, while the count operation is performed. Thus, the signal inputted to the first latch 210 do not toggle inside the first latch 210.

The second latch 220 receives the output signal of the first latch 210, and outputs the output signal DP<1> of the first flip-flop 112. The second latch 220 delays the output signal of the first latch 210 by a predetermined time in a state where the output signal is latched. The second latch 220 includes two transmission gates 221 and 222 and two inverters 223 and 224. Each of the two transmission gates 221 and 222 receives the second count completion signal ED and the output signal of the inverter 215, and the inverter 215 inverts the second count completion signal ED. The transmission gate 221 is turned on to output an input signal when the second count completion signal ED is at the logic high level, and turned of to not output an input signal when the second count completion signal ED is at the logic low level. On the other hand, the transmission gate 222 is turned on to output an input signal when the second count completion signal ED is at the logic low level, and turned off to not output an input signal when the second count completion signal ED is at the logic high level. The output signal of the first latch 210, inputted to the second latch 220, is latched by two inverters 223 and 224. Thus, when the second count completion signal ED inputted to the two transmission gates 221 and 222 is a pulse signal, the output signal of the first latch 210, inputted to the inverter 224, is inverted to toggle. However, the second count completion signal ED inputted to the first and second count units 110 and 120 provided in the digital counter 101 according to the first embodiment of the present invention is maintained at a constant level, for example, the logic high or low level while the count operation is performed. Thus, the signal inputted to the second latch 220 does not toggle inside the second latch 220.

As described above, the signals inputted to the first and second count units 110 and 120 do not toggle therein. Thus, power consumed by the first and second count units 110 and 120 may be minimized.

Thus, the power consumption of the digital counter 101 according to the first embodiment of the present invention is significantly reduced.

FIG. 3 is a circuit diagram of the pulse generator 150 illustrated in FIG. 1. Referring to FIG. 3, the pulse generator 150 may include a first delay 151, a second delay 152, an inverter 153, and an AND gate 154.

The first delay 151 delays the main count completion signal CMP by a predetermined time, and outputs the delayed signal as the second count completion signal ED.

The second delay 152 delays the second count completion signal ED, and outputs the delayed signal.

The inverter 153 inverts the output signal of the second delay 152, and outputs the inverted signal.

The AND gate 154 receives the main count completion signal CMP and the output signal of the inverter 153, performs an AND operation on the received signals, and outputs the first count completion signal PS.

Referring to FIGS. 1 to 4, the count operation of the digital counter 101 will be described.

At the initial stage, the main count completion signal CMP is at the logic low level, and the digital counter 101 performs a normal count operation. The digital counter 101 increases the digital values of the third and fourth count units 130 and 140, that is, the third and fourth bit signals D<2> and D<3>, by 1 at each rising edge of the second clock signal C2. The first bit signal D<0> outputted from the first count unit 110 and the second bit signal D<1> outputted from the second count unit 120 do not toggle, but maintain a constant value.

Since the second count completion signal ED for controlling the multiplexer 132 is at the logic low level, the output terminal of the multiplexer 132 is coupled to the inverting output terminal Qb of the third flip-flop 131. Thus, the inverted signal of the third bit signal D<2> is inputted to the input terminal of the third flip-flop 131, and the third bit signal D<2> toggles at a rising edge of the second clock signal C2.

Since the main count completion signal CMP is at the logic low level, the first and second count completion signals PS and ED outputted from the pulse generator 150 maintain the logic low level. Since the first count completion signal PS maintains the logic low level, the output signals P1 and P2 of the first and second AND gates 111 and 121 maintain the logic low level at all times, regardless of the values of the first and second dock signals C1 and C2. Thus, it is possible to prevent signals from toggling at the internal nodes of the first and second flip-flops 112 and 122.

Furthermore, although the first and second clock signals C1 and C2 toggle in a state where the main count completion signal CMP is at the logic low level, input signals do not toggle in the first and second AND gates 111 and 121 and the pulse generator 150 as well as the first to fourth flip-flops 112, 122, 131, and 140. Thus, substantially no power is consumed.

Table 1 below shows power consumption based on the amount of pulse toggling generated in flip-flops of a conventional digital counter and the digital counter 101 according to the first embodiment of the present invention. In Table 1, a four-bit counter including four flip-flops 112, 122, 131, and 140 is described as an example, for a simple description.

TABLE 1

| | 112 | | 122 | | 131 | | 140 | | Total | |
|---|---|---|---|---|---|---|---|---|---|---|
| | Latch 1 | Latch 2 | Latch 1 | Latch 2 | Latch 1 | Latch 2 | Latch 1 | Latch 2 | toggling count | Power consumption |
| Convention all counter | 513 | 512 | 257 | 256 | 129 | 128 | 65 | 64 | 1924 | 100% |
| Present invention | 1 | 1 | 1 | 1 | 129 | 128 | 65 | 65 | 386 | 20.1% |

As shown in Table 1, the power consumption of the digital counter 101 according to the first embodiment of the present invention is significantly reduced in comparison with the conventional digital counter. For example, the power consumption of the digital counter 101 may be reduced to 20% of that of the conventional digital counter.

Figure 5:
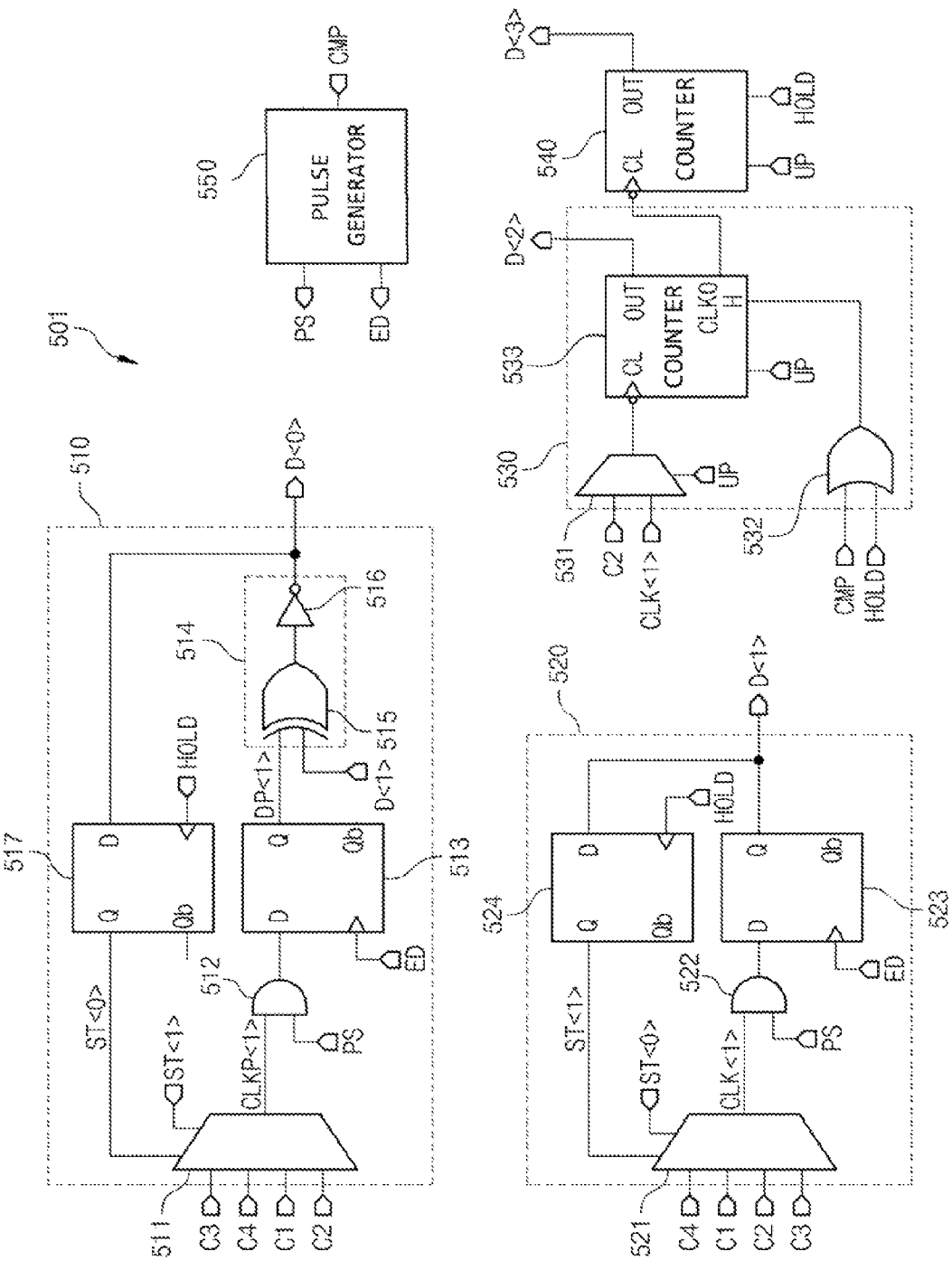
FIG. 5 is a circuit diagram of a digital counter according to a second embodiment of the present invention.

FIG. 5 is a circuit diagram of a digital counter 501 according to a second embodiment of the present invention. The digital counter 510 illustrated in FIG. 5 additionally includes an up count function and a down count function, compared to the digital counter 101 illustrated in FIG. 1. Referring to FIG. 5, the digital counter 501 includes a pulse generator 550 and first to fourth count units 510 to 540.

The digital counter 501 receives a main count completion signal CMP and first to fourth external dock signals C1 to C4 from outside, and outputs four-bit count signals D<0> to D<3>. FIG. 5 illustrates a four-bit digital counter. In another embodiment, a four or more-bit digital counter or a four or less-bit digital counter may be used.

Figure 6:
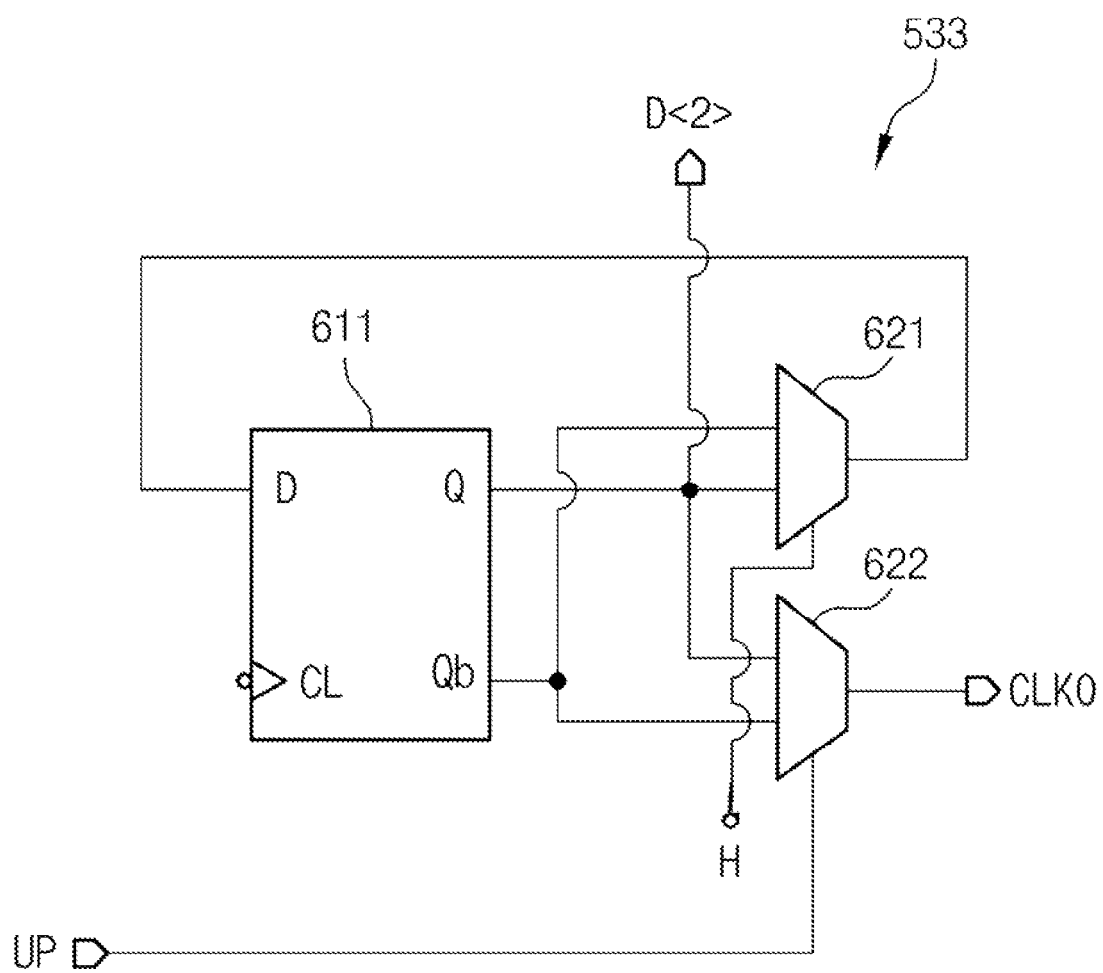
FIG. 6 is a circuit diagram of a counter provided in a third count unit of FIG. 5.
Figure 7:
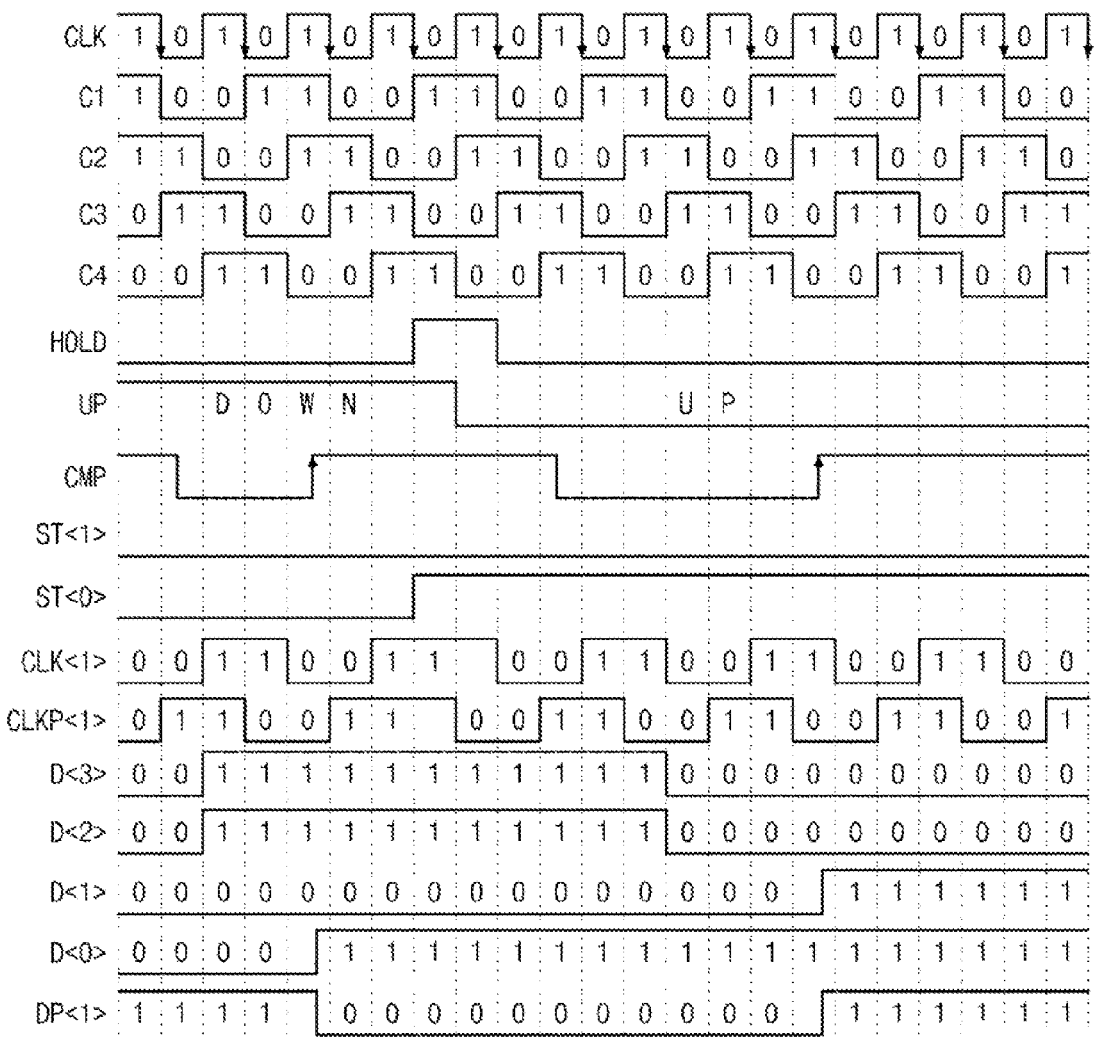
FIG. 7 is a timing diagram of signals of the digital counter illustrated in FIG. 5.

FIG. 7 is a timing diagram of signals of the digital counter 501 illustrated in FIG. 5. Hereafter, referring to FIG. 7, the configuration and operation of the digital counter 501 illustrated in FIGS. 5 and 6 will be described.

The pulse generator 550 receives the main count completion signal CMP from outside, and outputs first and second count completion signals PS and ED in response to the main count completion signal CMP. The main count completion signal CMP may indicate that a count operation is completed. The pulse generator 550 is coupled to the first and second count units 510 and 520. Thus, the pulse generator 550 transmits the first and second count completion signals PS and ED to the first and second count units 510 and 520. Since the pulse generator 550 is configured and operated in the same manner as illustrated in FIG. 3, the duplicate descriptions are omitted herein.

The first count unit 510 outputs the first bit signal D<0> having a constant level in response to a first internal clock signal CLKP<1>. The first count unit 510 includes a first AND gate 512, a first flip-flop 513, an XNOR gate 514, a second flip-flop 517, and a first multiplexer 511.

The first AND gate 512 receives the first internal clock signal CLKP<1> and the first count completion signal PS, and performs an AND operation on the received signals. That is, the first AND gate 512 outputs a logic low-level signal when the first count completion signal PS is at a logic low level, and outputs the first internal dock signal CLKP<1> when the first count completion signal PS is at a logic high level.

The first flip-flop 513 receives the output signal of the first AND gate 512 and the second count completion signal ED, and delays the output signal of the first AND gate 512 by a predetermined time in synchronization with the second count completion signal ED. The first flip-flop 513 may be configured with a delay flip-flop. Referring to FIG. 7, the main count completion signal CMP toggles once during each of a down count operation and an up count operation. Thus, the first count completion signal PS and the second count completion signal ED toggle once during each of the down count operation and the up count operation. Thus, the output signal DP<1> of the first flip-flop 513 maintains a constant voltage level during the down count operation and the up count operation.

The XNOR gate 514 receives the output signal DP<1> of the first flip-flop 513 and the second bit signal D<i> (outputted from the second count unit 520), and outputs the first bit signal D<0>. The XNOR gate 514 outputs the first bit signal D<0> at the logic low level when any one of the input signals is at the logic high level, and outputs the first bit signal D<0> at the logic high level when both of the input signals are at the logic high or low level. Referring to FIG. 7, the output signal DP<1> of the first flip-flop 513 and the second bit signal D<1> are maintained at a constant level during a down count operation and an up count operation. Thus, the first bit signal D<0> is also maintained at a constant level. As illustrated in FIG. 5, the XNOR gate 514 may include an XOR gate 515 and an inverter 516.

The second flip-flop 517 receives the first bit signal D<0> and a down count signal HOLD, and delays the first bit signal D<0> by a predetermined time in synchronization with the down count signal HOLD. The second flip-flop 517 may be configured with a delay flip-flop. Referring to FIG. 7, the down count signal HOLD is maintained at the logic low level during the down count operation, and an output signal ST<0> of the second flip-flop 517 is maintained at the logic low level during the down count operation. Then, when the up count operation is started, the down count signal HOLD is generated as a pulse signal. Thus, during the up count operation, the output signal ST<0> of the second flip-flop 517 is maintained at the logic high level.

The first multiplexer 511 receives a plurality of external clock signals, for example, the first to fourth external clock signals C1 to C4, and transmits one of the first to fourth external clock signals C1 to C4 as the first internal clock signal CLKP<1> to the first AND gate 512, based on the output signal ST<0> of the second flip-flop 517 and an output signal ST<1> of the fourth flip-flop 524. Referring to FIG. 7, the output signal ST<0> of the second flip-flop 517 and the output signal ST<1> of the fourth flip-flop 524 are maintained at the logic low level during the down count operation. Thus, the first multiplexer 511 outputs the third external clock signal C3 as the first internal clock signal CLKP<1>. During the up count operation, the output signal ST<0> of the second flip-flop 517 is maintained at the logic high level, and the output signal ST<1> of the fourth flip-flop 524 is maintained at the logic low level. Thus, the first multiplexer 511 outputs the fourth external clock signal C4 as the first internal dock signal CLKP<1>.

The second count unit 520 outputs the second bit signal D<1> having a constant level in response to a second internal dock signal CLK<1>. The second unit 520 includes a second AND gate 522, a third flip-flop 523, a fourth flip-flop 524, and a second multiplexer 521.

The second AND gate 522 receives the second internal clock signal CLK<1> and the first count completion signal PS, and performs an AND operation on the received signals. That is, the second AND gate 522 outputs a logic low-level signal when the first count completion signal PS is at the logic low level, and outputs the second internal clock signal CLK<1> when the first count completion signal PS is at the logic high level.

The third flip-flop 523 receives the output signal of the second AND gate 522 and the second count completion signal ED, and outputs the second bit signal D<1>. That is, the third flip-flop 523 delays the output signal of the second AND gate 522 by a predetermined time in synchronization with the second count completion signal ED, and outputs the delayed signal as the second bit signal D<1>. The third flip-flop 523 may be configured with a delay flip-flop. Referring to FIG. 7, the main count completion signal CMP toggles once during each of the down count operation and the up count operation. Thus, the first count completion signal PS and the second count completion signal ED also toggle once during each of the down count operation and the up count operation. The second bit signal D<1> maintains a constant voltage level during the down count operation and the up count operation.

The fourth flip-flop 524 receives the second bit signal D<1> and the down count signal HOLD, and delays the second bit signal D<1> by a predetermined time in synchronization with the down count signal HOLD. The fourth flip-flop 524 may be configured with a delay flip-flop. Referring to FIG. 7, the down count signal HOLD and the second bit signal D<1> are maintained at the logic low level during the down count operation. Thus, the output signal S<1> of the fourth flip-flop 524 is maintained at the logic low level during the down count operation. Since the down count signal HOLD is maintained at the logic low level even during the up count operation, the output signal S<1> of the fourth flip-flop 524 is continuously maintained at the logic low level.

The second multiplexer 521 receives a plurality of external clock signals, for example, the first to fourth external clock signals C1 to C4, and transmits one of the first to fourth external clock signals C1 to C4 as the second internal clock signal CLK<1> to the second AND gate 522, based on the output signal ST<1> of the fourth flip-flop 524 and the output signal ST<0> of the second flip-flop 517. Referring to FIG. 7, both the output signal ST<1> of the fourth flip-flop 524 and the output signal ST<0> of the second flip-flop 517 are maintained at the logic low level during the down count operation. Thus, the second multiplexer 521 outputs the fourth external clock signal C4 as the second internal clock signal CLL<l>. During the up count operation, the output signal ST<1> of the fourth flip-flop 524 is maintained at the logic low level, and the output signal ST<0> of the second flip-flop 517 is maintained at the logic high level. Thus, the second multiplexer 521 outputs the first external clock signal C1 as the second internal clock signal CLK<1>.

The third count unit 530 outputs the third bit signal D<2> in response to the second internal clock signal CLK<1> and performs one of an up count operation and a down count operation in response to an up count signal UP and the down count signal HOLD. The third count unit 530 includes a third multiplexer 531, an OR gate 532, and a counter 533.

The third multiplexer 531 selects and outputs one of the second internal clock signal CLK<1> and one of the plurality of external clock signals, i.e., the second external clock signal C2, based on the up count signal UP.

The OR gate 532 performs an OR operation on the main count completion signal CMP and the down count signal HOLD. That is, the OR gate 532 outputs a logic high-level signal when at least one of the main count completion signal CMP and the down count signal HOLD is at the logic high level, and outputs a logic low-level signal when both of the main count completion signal CMP and the down count signal HOLD are at the logic low level. The output signal of the OR gate 532 is transmitted to a down count terminal H of the counter 533.

The counter 533 performs one of the up count operation and the down count operation in response to the output signal of the OR gate 532 and the up count signal UP, and outputs the third bit signal D<2> in response to the output signal of the third multiplexer 531.

The fourth count unit 540 receives the up count signal UP, the down count HOLD, and an inverted signal of the third bit signal D<0> outputted from the third count unit 530, and outputs the fourth bit signal D<3>. The fourth count unit 540 performs one of the up count operation and the down count operation in response to the up count signal UP and the down count signal HOLD, and performs a count operation by outputting the fourth bit signal D<3> in response to the inverted signal of the third bit signal D<0>.

FIG. 6 is a circuit diagram of the counter 533 provided in the third count unit 530 of FIG. 5. Referring to FIG. 6, the counter 533 includes a delay flip-flop 611 and two multiplexers 621 and 622. The counter 533 is configured in the same manner as the fourth count unit 540 of FIG. 5, and FIG. 5 representatively illustrates the counter 533.

The delay flip-flop 611 receives the dock signal CLK through a dock terminal CL and an output signal of the first multiplexer 621 through an input terminal D, and outputs the third bit signal D<2>. That is, the delay flip-flop 611 delays the output signal of the first multiplexer 621 by a predetermined time in synchronization with the clock signal CLK.

The first multiplexer 621 receives the third bit signal D<2> and an inverted signal of the third bit signal D<2>, selects one of the two input signals based on a signal inputted to a down count terminal H, and transmits the selected signal to the input terminal D of the delay flip-flop 611.

The second multiplexer 622 receives the third bit signal D<2> and the inverted signal of the third bit signal D<2>, selects one of the two input signals based on the up count signal UP, and transmits the selected signal as an inverted signal CLK0 of the clock signal CLK to the fourth count unit 540.

Referring to FIGS. 5 to 7, the count operation of the digital counter 501 will be described. The count operation may be divided into a down count operation, a hold operation, and an up count operation, for a simplified description.

First, the down count operation will be described.

At the initial stage, the up count signal UP is set to the logic high level for a down count operation. Thus, the third multiplexer 531 of the third count unit 530 outputs the second external clock signal C2. Then, the third and fourth count units 530 and 540 output the third and fourth bits signals D<2> and D<3> to start a down count operation, in synchronization with a falling edge of the second external dock signal C2. At this time, the first and second multiplexer 511 and 521 check the values of the first and second bit signals D<0> and D<1>, and determine the second internal clock signal CLK<1> inputted to the third count unit 530. In particular, when the down count operation is completed, the number of possible combinations of the output signal ST<0> of the second flip-flop 517 and the output signal ST<1> of the fourth flip-flop 524 is four. Based on the combinations of the output signal ST<0> of the second flip-flop 517 and the output signal ST<1> of the fourth flip-flop 524, the first and second internal clock signals CLKP<1> and CLK<1> outputted from the first and second multiplexers 511 and 512 are determined. That is, based on the combinations of the output signal ST<0> of the second flip-flop 517 and the output signal ST<1> of the fourth flip-flop 524, one of the first to fourth external clock signals C1 to C4 is selected as the first internal clock signal CLKP<1> or the second internal clock signal CLK<1>. Then, the second internal clock signal CLK<1> is selected and inputted to the third count unit 530. Specifically, both the output signal ST<0> of the second flip-flop 517 and the output signal ST<1> of the fourth flip-flop 524 have a logic low-level value. Thus, the first and second multiplexers 511 and 521 output signals to be inputted to a first node X00. The first and second multiplexers 511 and 512 have four input nodes X00, X01, X10, and X11, which are sequentially arranged from the top. Thus, the third external dock signal C3 becomes the first internal clock signal CLKP<1>, and the fourth external clock signal D4 becomes the second internal dock signal CLK<1>.

When the main count completion signal CMP transitions from the logic low level to the logic high level after the down count operation is started, the down count operation is completed. The first count completion signal PS becomes the logic high level at a rising edge of the main count completion signal CMP. Thus, the first internal clock signal CLKP<1> is latched in the input terminal of the first flip-flop 513, and the second internal clock signal CLK<1> is latched in the input terminal of the third flip-flop 523. Then, the signal latched in the input terminal of the first flip-flop 513 is latched in the output terminal of the first flip-flop 513, and the signal latched in the input terminal of the third flip-flop 523 is latched in the output terminal of the third flip-flop 523, at a rising edge of the second count completion signal ED. The signal latched in the output terminal of the first flip-flop 513 is outputted as the first bit signal D<0> by the XNOR gate 514, and the signal latched in the output terminal of the third flip-flop 523 is outputted as second bit signal D<1>. Then, the first count completion signal PS becomes the logic low level.

As described above, the first count completion signal PS becomes the logic high level at a rising edge of the main count completion signal CMP only for a while, and then maintains the logic low level. Thus, signals inputted to the first and third flip-flops 513 and 523 maintain the logic low level. As a result, the signals do not toggle in the internal nodes of the first and third flip-flops 513 and 523.

As the signals do not toggle in the internal nodes of the first and third flip-flops 513 and 523, power consumed in the first and second count units 510 and 520 is significantly reduced.

Second, the hold operation will be described.

When the down count operation is completed, the count result stored as the first to fourth bit signals D<0> to D<3>. That is, when the down count signal HOLD transitions to the logic high level, the third bit signals D<2> of the output terminal Q of the delay flip-flop 611 in the counter 533 is inputted to the input terminal D thereof. Thus, the count result value is maintained at all times.

After the down count signal HOLD transitions to the logic high level, the up count signal UP transitions to the logic low level to prepare an up count operation. When the up count signal UP transitions to the logic low level, the second internal clock signal CLK<1> is selected as an input clock of the counter 533 by the third multiplexer 531. The second internal clock signal CLK<1> is selected by the second multiplexer 521. In the example of FIG. 5, when the down count signal HOLD transitions from the logic low level to the logic high level, the output signal ST<0> of the second flip-flop 517 becomes the logic high level, and the output signal ST<1> of the fourth flip-flop 524 is maintained at the logic low level. Thus, the first external dock signal C1 is selected as the first internal clock signal CLKP<1>, and the second external clock signal C2 is selected as the second internal clock signal CLK<1>.

Third, the up count operation will be described.

As described in the hold operation, the second internal clocks signal CLK<1> is selected as an input clock of the counter 533 during the hold operation. Furthermore, since the output signal ST<0> of the second flip-flop 517 is at the logic high level and the output signal ST<1> of the fourth flip-flop 524 is at the logic low level, the first external clock signal C2 is outputted as the second internal clock signal CLK<1>. Thus, the digital values of the third bit signal D<2> and the fourth bit signal D<3> are increased by 1 at a falling edge of the first external clock signal C1.

When the main count completion signal CMP transitions from the logic low level to the logic high level after the up count operation is started, the up count operation is ended. The first count completion signal PS transitions to the logic high level at a rising edge of the main count completion signal CMP. Thus, the first internal clock signal CLKP<1> is latched in the input terminal of the first flip-flop 513, and the second internal clock signal CKL<1> is latched in the input terminal of the third flip-flop 523. Then, the signal of the input terminal of the first flip-flop 513 is latched in the output terminal of the first flip-flop 513, and the signal of the input terminal of the third flip-flop 523 is latched in the output terminal of the third flip-flop 523, at a rising edge of the second count completion signal ED. The signal latched in the output terminal of the first flip-flop 513 is outputted as the first bit signal D<0> by the XNOR gate 514, and the signal latched in the output terminal of the third flip-flop 523 is outputted as the second bit signal D<1>. Then, the first count completion signal PS becomes the logic low level.

As described above, the first count completion signal PS becomes the logic high level at a rising edge of the main count completion signal CMP only for a while, and then maintains the logic low level. Thus, the signals inputted to the first and third flip-flops 513 and 523 maintain the logic low level. As a result, the signals do not toggle in the internal nodes of the first and third flip-flops 513 and 523.

As the signals do not toggle in the internal nodes of the first and third flip-flops 513 and 523, power consumed in the first and second count units 510 and 520 is significantly reduced.

Referring to FIG. 7, the down count result is −3, and the up count result is +3 after the up count operation is repeated six times, which indicates that the up/down count function is accurately performed.

According to the embodiments of the present invention, the first bit signal outputted from the first count unit and the second bit signal outputted from the second count unit do not toggle in the first and second count units.

As the signals do not toggle in the first and second count units, no significant power consumption occurs in the first and second count units.

Thus, the power consumption of the digital counter is significantly reduced.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A digital counter comprising:
  a first count unit suitable for outputting a first bit signal having a constant level in response to at least one of a first clock signal, first and second count completion signals, while a count operation is performed;
  a second count unit suitable for outputting a second bit signal having a constant level in response to at least one of a second clock signal, the first and second count completion signals, while the count operation is performed;
  a third count unit suitable for outputting a third bit signal toggling in response to at least one of the second clock signal and the second count completion signal, and performing the count operation; and
  a pulse generator suitable for outputting the first and second count completion signals in response to a main count completion signal indicating that the count operation is completed, and transmitting at least one of the first and second completion signals to the first to third count units.

2. The digital counter according to claim 1, wherein the third count unit completes the count operation in response to at least one of the main count completion signal, the first count completion signal, and the second count completion signal, and then outputs the third bit signal having a constant level.

3. The digital counter according to claim 1, wherein, when the main count completion signal is activated to stop the count operation, the first to third bit signals are maintained at voltage levels which the first to third bit signals have immediately before the main count completion signal is activated.

4. The digital counter according to claim 1, wherein the first count unit comprises:
  a first AND gate suitable for performing an AND operation on the first clock signal and the first count completion signal;
  a first flip-flop suitable for delaying an output signal of the first AND gate by a predetermined time in synchronization with the second count completion signal; and
  an exclusive NOR (XNOR) gate suitable for performing an XNOR operation on an output signal of the first flip-flop and the second bit signal, and outputting an operation result as the first bit signal.

5. The digital counter according to claim 1, wherein the second count unit comprises:
  a second AND gate suitable for performing an AND operation on the second clock signal and the first count completion signal; and
  a second flip-flop suitable for delaying an output signal of the second AND gate by a predetermined time in synchronization with the second count completion signal, and outputting a delayed signal as the second bit signal,
  wherein when the second count completion signal is activated, the second bit signal is maintained in a previous state.

6. The digital counter according to claim 1, wherein the third count unit comprises:
  a third flip-flop suitable for outputting the third bit signal in synchronization with the second clock signal; and
  a multiplexer suitable for transmitting an inverted signal of the third bit signal to an input terminal of the third flip-flop when the second count completion signal is deactivated, and transmitting the third bit signal to the input terminal of the third flip-flop when the second count completion signal is activated.

* * * * *